(12) United States Patent
Kodaira

(10) Patent No.: US 7,786,576 B2
(45) Date of Patent: Aug. 31, 2010

(54) SEMICONDUCTOR DEVICE, METHOD OF MANUFACTURING SEMICONDUCTOR DEVICE, AND ELECTRONIC APPARATUS

(75) Inventor: Taimei Kodaira, Chino (JP)

(73) Assignee: Seiko Epson Corporation, Tokyo (JP)

( * ) Notice: Subject to any disclaimer, the term of this patent is extended or adjusted under 35 U.S.C. 154(b) by 64 days.

(21) Appl. No.: 12/012,182

(22) Filed: Jan. 31, 2008

(65) Prior Publication Data

US 2008/0185689 A1 Aug. 7, 2008

(30) Foreign Application Priority Data

Feb. 6, 2007 (JP) ............................. 2007-026466

(51) Int. Cl.
*H01L 23/04* (2006.01)
(52) U.S. Cl. .............................. 257/730; 257/E23.124
(58) Field of Classification Search ................. 257/667, 257/669, 688, 713, 730, E23.124, E23.126
See application file for complete search history.

(56) References Cited

U.S. PATENT DOCUMENTS 4,777,563 A * 10/1988 Teraoka et al. ............... 361/739
6,794,739 B2 * 9/2004 Kobayashi et al. ........... 257/673

FOREIGN PATENT DOCUMENTS

| JP | 10-125929 | 5/1998 |
|----|-----------|--------|
| JP | 2005-175445 A | 6/2005 |
| JP | 2005-259984 | 9/2005 |
| JP | 2006-049800 | 2/2006 |
| JP | 2006-119810 | 5/2006 |
| JP | 2006-119811 | 5/2006 |
| JP | 2006-120720 | 5/2006 |
| JP | 2006-120726 | 5/2006 |
| JP | 2006-135051 | 5/2006 |
| JP | 2006-227417 A | 8/2006 |
| JP | 2006-295033 | 10/2006 |
| JP | 2006-295049 | 10/2006 |
| JP | 2006-301493 | 11/2006 |
| JP | 2006-303166 | 11/2006 |
| JP | 2006-310398 | 11/2006 |
| JP | 2006-310399 | 11/2006 |
| JP | 2006-313827 | 11/2006 |
| JP | 2007-088235 | 4/2007 |
| JP | 2007-201249 | 8/2007 |

* cited by examiner

*Primary Examiner*—Quoc D Hoang
(74) *Attorney, Agent, or Firm*—AdvantEdge Law Group, LLC

(57) ABSTRACT

A semiconductor device includes a substrate having a resin layer on at least a surface thereof; a thin-film circuit layer provided on the substrate, and a reinforcing section provided on the surface of the substrate so as to surround the thin-film circuit layer.

6 Claims, 11 Drawing Sheets

SEMICONDUCTOR DEVICE, METHOD OF MANUFACTURING SEMICONDUCTOR DEVICE, AND ELECTRONIC APPARATUS

BACKGROUND

1. Technical Field

The present invention relates to a semiconductor device, a method of manufacturing the semiconductor device, and an electronic apparatus.

2. Related Art

A semiconductor device such as a thin-film circuit device and a liquid crystal device includes a thin-film circuit layer having a semiconductor element and the like on a surface of a substrate. Examples of a material typically used for the substrate include a single crystal silicon wafer, a quart glass substrate, a heat resistance glass substrate, a resin film, and a stainless substrate. The semiconductor device using the resin film as a substrate is significant in that a light and flexible semiconductor device can be provided since the substrate itself is thin and has flexibility. JP-A-10-125929 is an example of related art.

In case of manufacturing the above semiconductor device, there is employed a so-called multipatterning method in which a plurality of thin-film circuit layers are formed on a motherboard and then the motherboard is divided into thin-film circuit layers. Also, there is a case in which the semiconductor device is manufactured such that the thin-film circuit layers formed on a glass substrate are then transferred, since the resin film has a relatively low heat resistance property, it is thus hard to form the thin-film circuit layer directly thereonto. Generally, the thin-film circuit layer has an elastic constant of about several tens of GPa and a linear expansion coefficient in a range between several and several tens ppm/K. On the other hand, the resin film has an elastic constant of about several GPa and a linear expansion coefficient in a range between 10 and 50 ppm/K.

In the above described semiconductor device, however, end portions of the substrate may include minute cracks and notches formed when the motherboard is divided into individual semiconductor devices. If a concentrated stress is applied to such cracks and notches, the cracks may expand into the thin-film circuit layer, which could lead the thin-film circuit layer to break up. Such breakup of the thin-film circuit layer would cause malfunction of the semiconductor device. Therefore, such a technique is required that the thin-film circuit layer can be prevented from breaking up and thereby being capable of providing a high reliability.

SUMMARY

An advantage of some aspects of the invention is that it provides a semiconductor device, a method of manufacturing the semiconductor device, and an electronic apparatus capable of securing high reliability.

The semiconductor device according to a first aspect of the invention includes a substrate having a resin layer on at least a surface thereof, a thin-film circuit layer provided on the substrate, and a reinforcing section provided on the surface of the substrate so as to surround the thin-film circuit layer in order to achieve the above described advantage.

According to an aspect of the invention, the reinforcing section for reinforcing the substrate is provided on the surface of the substrate so as to surround the thin-film circuit layer, so that a region of the substrate where the reinforcing section is provided will have an improved strength of the substrate. Accordingly, for example, when the semiconductor device is formed by a multipatterning method, minute cracks and notches caused upon dividing the substrate can be prevented from expanding into the thin-film circuit layer. As such, a semiconductor device is obtainable that can secure a high reliability.

The above semiconductor device is characterized in that the reinforcing section is formed into a protrusion provided on the surface of the substrate.

According to another aspect of the invention, since the reinforcing section is formed as the protrusion provided on the surface of the substrate, the region where the reinforcing section is provided can be made thicker than the other region. Accordingly, the region of the substrate where the reinforcing section is provided can be made stronger.

The above semiconductor device is characterized in that it has a plurality of reinforcing sections.

According to a further aspect of the invention, since there are a plurality of reinforcing sections, multilevel protection can be provided against the cracks and the notches expanding from the end portions of the substrate. As such, the breakup of the thin-film circuit layer is avoidable in a more secured manner.

The above semiconductor device is characterized in that the substrate has a rectangular shape, and the reinforcing section is provided at a region including corners of the substrate.

When the motherboard is divided into a plurality of rectangular substrates by the multipatterning method, the cracks and the notches especially occur at the corners of the rectangular substrate. According to the invention, the reinforcing section is provided in a region including corners of the rectangular substrate, such that expansion of the cracks and the notches into the thin-film circuit layer is avoidable in a more secured manner.

A method of manufacturing a semiconductor device of the invention includes: forming a plurality of thin-film circuit layers on the substrate having at least a resin layer on its surface; forming a plurality of reinforcing sections in such a manner that each of the reinforcing sections surrounds a corresponding one of the plurality of the thin-film circuit layers; and cutting the substrate between the adjacent reinforcing sections of the plurality of reinforcing sections in order to divide the substrate into the plurality of thin-film circuit layers one by one.

According to a still further aspect of the invention, the plurality of thin-film circuit layers are formed on the substrate having the resin layer formed on at least a surface thereof, the plurality of reinforcing sections are formed such that each of the reinforcing sections surround a corresponding one of the plurality of thin-film circuit layers respectively, and the substrate is then cut between the adjacent reinforcing sections of the plurality of reinforcing sections to divide it into the plurality of thin-film circuit layers one by one, such that it is possible to prevent the cracks and the notches caused in cutting the substrate from expanding into the region of the thin-film circuit layer. As such, the thin-film circuit layer can be securely prevented from breaking up, thereby making it possible to manufacture a highly reliable semiconductor device.

The above described method of manufacturing the semiconductor device is characterized in that the reinforcing sections are formed on an element substrate different from the substrate and thereafter thus-formed reinforcing sections are transferred onto the substrate.

According to a still further aspect of the invention, the reinforcing sections are formed on the element substrate different from the substrate to thereafter transfer those reinforcing sections onto the substrate, which makes it easy to form the reinforcing sections.

A method of manufacturing a semiconductor device of the invention includes forming a thin-film circuit layer onto a first substrate having a surface layer formed on a surface thereof, forming an reinforcing section on the surface layer surrounding the thin-film circuit layer, and transferring the thin-film circuit layer and the surface layer onto a second substrate having a resin layer at least on a surface thereof.

According to a still further aspect of the invention, the thin-film circuit layer is formed on the first substrate having the surface layer, the reinforcing section is formed on the surface layer surrounding the thin-film circuit layer, and then the thin-film circuit layer and the surface layer are transferred onto the second substrate having the resin layer at least on the surface of the second substrate, such that the thin-film circuit layer and the reinforcing section can be formed even on a substrate having a low heat resistance such as a resin film and can also be formed, of course, on a substrate having a high heat resistance such as a glass substrate. As described above, the method of manufacturing the semiconductor device according to the invention will expand the range of choices for a substrate on which a thin-film circuit layer and an reinforcing section are formed.

The method of manufacturing the above semiconductor device is characterized in that the reinforcing section is formed into a protrusion, which is provided on the surface of the substrate.

According to the invention, the reinforcing section is formed into the protrusion, which is provided on the surface of the substrate, such that there is an advantage that the reinforcing section can be formed with ease by transfer printing even on such a substrate onto which it would be difficult to transfer the protrusion directly.

The method of manufacturing the semiconductor device is characterized in that a plurality of reinforcing sections are provided.

According to a still further aspect of the invention, the plurality of reinforcing sections are formed by the transfer printing, such that the plurality of reinforcing sections can be formed with ease comparing to a case where the plurality of reinforcing sections are formed directly onto a substrate.

A semiconductor device according to a fourth aspect of the invention is characterized in being manufactured by the above method of manufacturing the semiconductor device.

According to a still further aspect of the invention, a semiconductor device capable of being applicable to various uses is obtainable since the semiconductor device is manufactured by an effective manufacturing method in a variety of materials can be used for the substrate, for example, a substrate having a low heat resistance such as a resin film or a substrate having a high heat resistance such as a glass substrate. Further, the region at which the reinforcing section is provided is reinforced doubly by the reinforcement provided by the reinforcing section and the joint provided by the transfer printing, such that the thin-film circuit layer can be securely prevented from breaking up. As such, a highly reliable semiconductor device is obtainable.

An electronic apparatus includes the above semiconductor device installed therein.

According to a still further aspect of the invention, the electronic apparatus less susceptible to breakdown or malfunction but being high quality is obtainable, since there is installed therein the semiconductor device having a high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described with reference to the accompanying drawings.

First Embodiment

Figure 1:
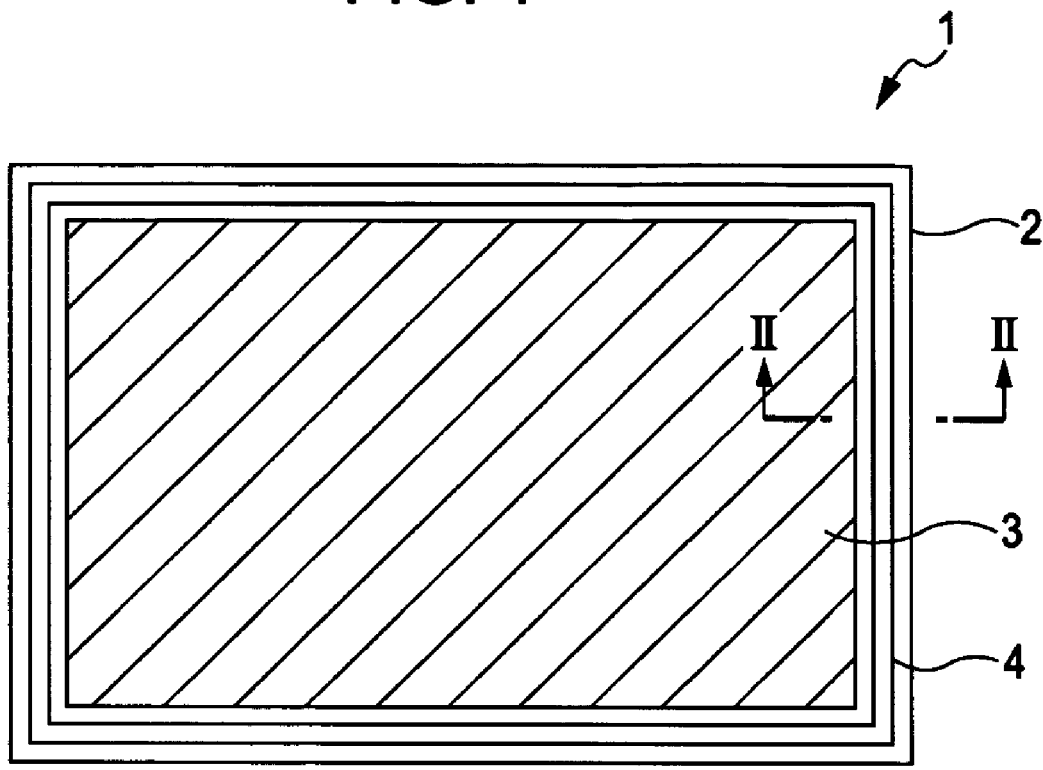
FIG. 1 is a plan view showing a structure of a semiconductor device according to a first embodiment of the invention.

A first embodiment of the invention will now be described. FIG. 1 is a plan view showing a structure of a semiconductor device according to the first embodiment.

As shown in FIG. 1, a semiconductor device 1 mainly includes a substrate 2, a thin-film circuit layer 3, and a reinforcing section 4. The thin-film circuit layer 3 is provided at a center portion of the substrate 2 in a plan view and is a circuit including a semiconductor element or the like. The reinforcing section 4 is provided on the substrate 2 so as to surround the thin-film circuit layer 3 and is a protrusion made of resin such as acrylic or polyimide.

Figure 2:
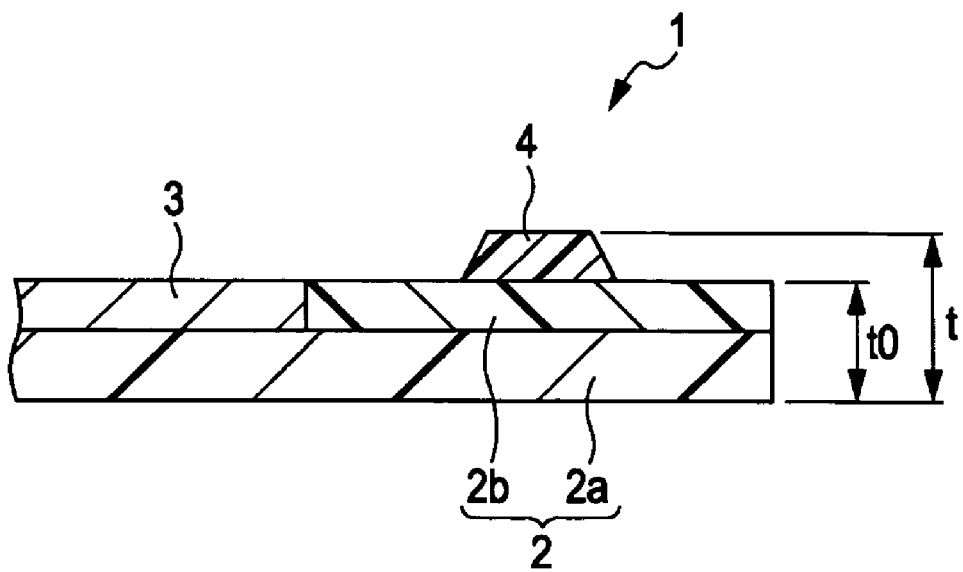
FIG. 2 is a cross sectional view showing a structure of the semiconductor device according to the first embodiment.

FIG. 2 is a view illustrating a structure of the semiconductor device in FIG. 1 taken along lines II-II.

As shown in FIG. 2, the substrate 2 mainly includes a base layer 2a and a surface layer 2b, in which the surface layer 2b is provided on a surface of the base layer 2a in a layered manner. The base layer 2a is made of a resin material and the surface layer 2b is made of a resin material or an inorganic material such as SiO$_2$. Examples of the resin material include acrylic and polyimide. The reinforcing section 4 is of a trapezoid shape (a protruding shape) in a cross sectional view and is provided on the surface layer 2b.

Owing to the reinforcing section 4, a thickness t of the substrate 2 at a region where the reinforcing section 4 is provided on the substrate is larger than a thickness t0 of the other region. Since the thickness t is larger than the thickness t0 of the other region, the region with the reinforcing section 4 is more resistant to deformation than the other region. Here, a preferable height of the reinforcing section 4 from the surface of the substrate 2 is equal to or less than 10 μm.

A process for manufacturing the semiconductor device 1 having the above described structure will now be described. The semiconductor device 1 is formed such that a motherboard 10 is provided with a plurality of thin-film circuit layers formed thereon and then is divided into individual thin-film circuit layers one by one to finally form the semiconductor device 1 (multipatterning method).

Figure 3:
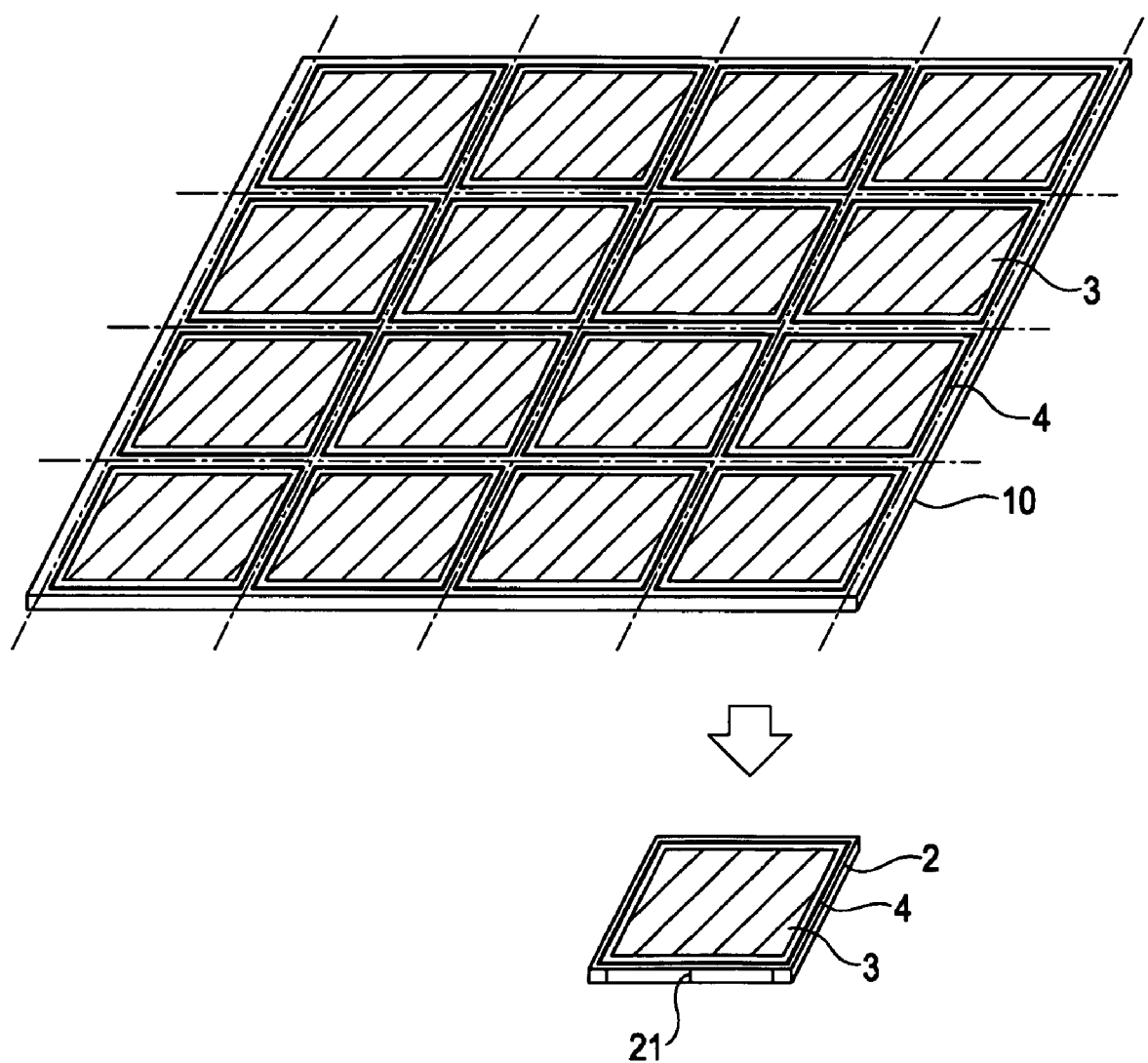
FIG. 3 is a flowchart showing a manufacturing process of the semiconductor device according to the first embodiment.

In the first embodiment, as shown in FIG. 3, each of the reinforcing sections 4 is formed so as to surround a respective region of the motherboard 10 where a corresponding one of the thin-film circuit layers 3 is formed. The reinforcing section may be formed with a dispenser, may be patterned by means of a photolithography method, or may be so formed that the reinforcing section is patterned on an another substrate, followed by transfer printing thereof.

After the thin-film circuit layers 3 and the reinforcing sections 4 are formed, the motherboard 10 is subjected to cutting. Examples of the cutting method include a mechanical cutting method using a rubbing stone, a knife edge, scissors, or the like or a laser scribe method, as required. Minute notches 21 occur at cut portions of the substrate 2 which is a cut piece.

Figure 4A:
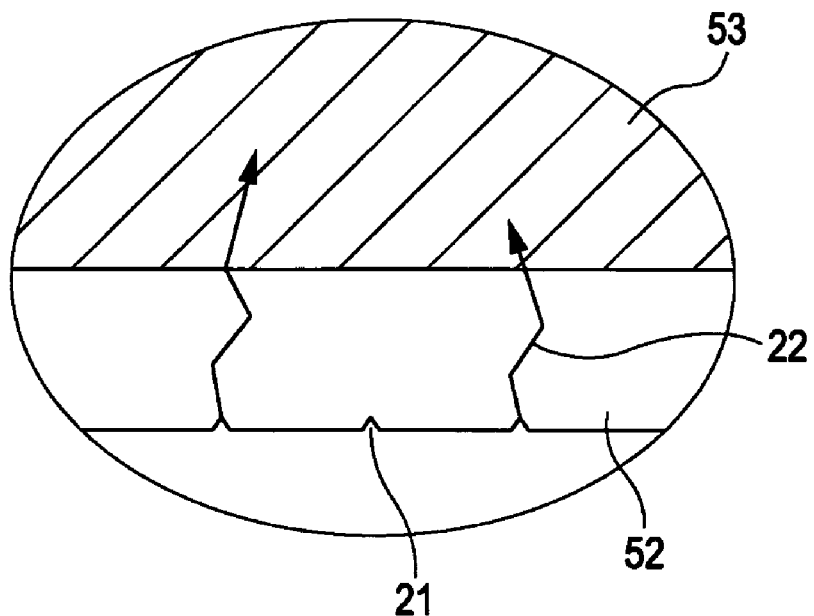
FIG. 4 is a view showing that cracks occur in a substrate.

When no reinforcing sections 4 are formed on the motherboard 10, if a stress is applied to the semiconductor device 1 due to a temperature change or a bending force, cracks will occur from the notches 21 of the substrate 52 as shown in FIG. 4A, which may finally reach the thin-film circuit layer 53. In such a case, the thin-film circuit layer 53 will break up.

Figure 4B:
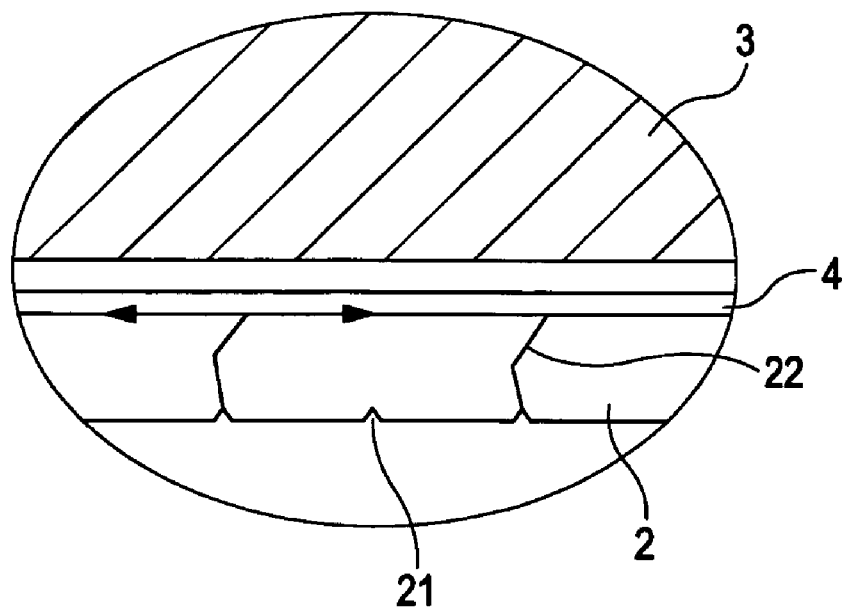

On the other hand, according to the first embodiment, the reinforcing section 4 for reinforcing the substrate 2 is provided so as to surround the thin-film circuit layer 3 on the surface layer 2b of the substrate 2, such that the region where the reinforcing section 4 is provided will improve the strength of the substrate 2. In such a case that the semiconductor device 1 is provided with notches 21 at the cut portions of the substrate 2 due to the multipatterning process as shown in FIG. 4B, the cracks 22 are prevented from expanding into the thin-film circuit layer 3 since the cracks 22 from the notches 21 will be stopped by the reinforcing section 4. As such, the semiconductor device 1 securely having the high reliability is obtainable.

Second Embodiment

Figure 5:
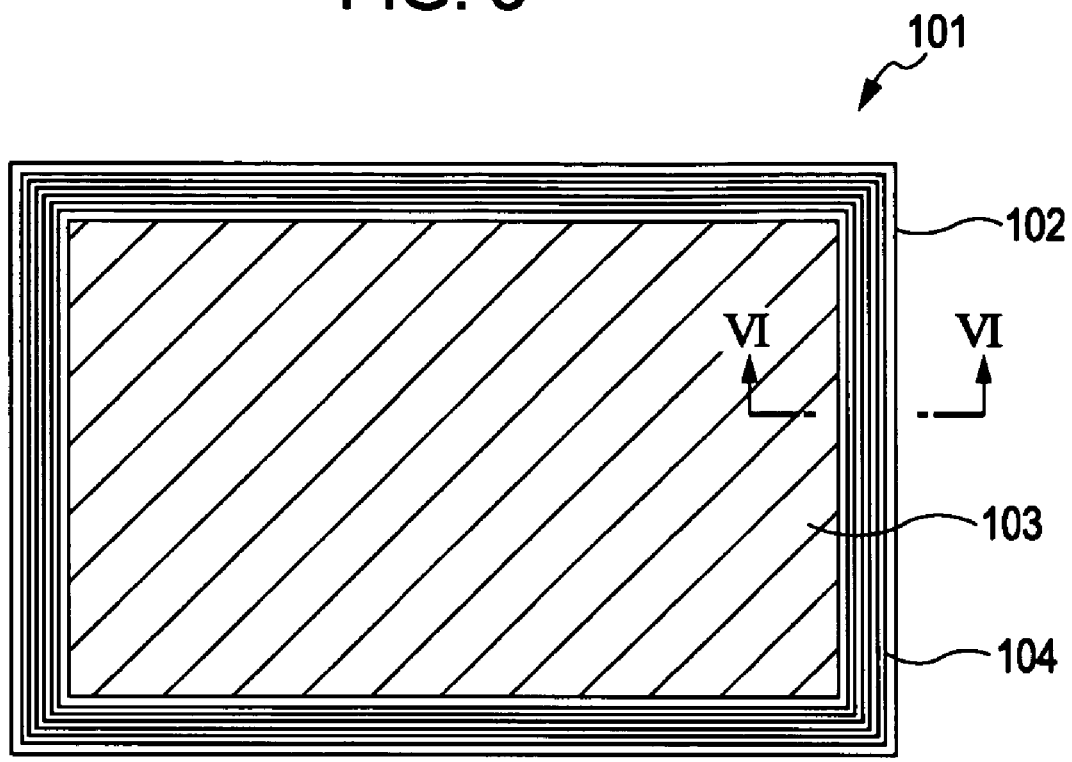
FIG. 5 is a plan view showing a structure of a semiconductor device according to a second embodiment of the invention.
Figure 6:
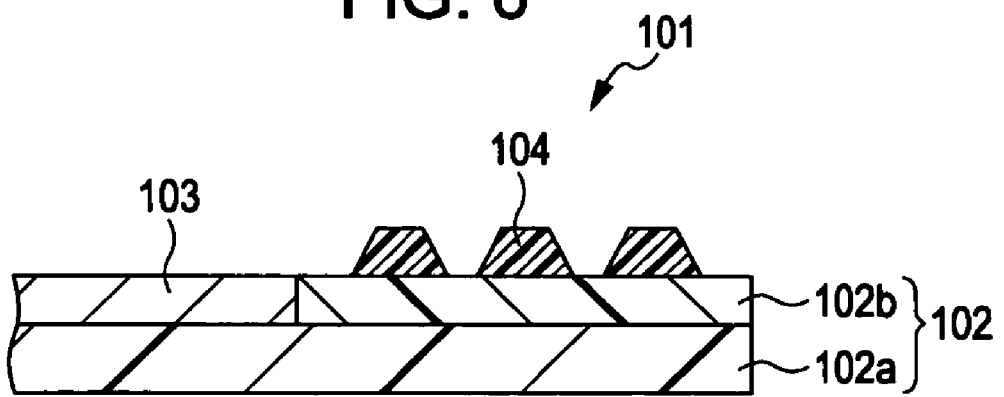
FIG. 6 is a cross sectional view showing a structure of the semiconductor device according to the second embodiment.

A second embodiment of the invention will be described below. FIG. 5 is a plan view showing a structure of the semiconductor device according to the second embodiment. FIG. 6 is a cross sectional view showing a structure of the semiconductor device in FIG. 5 taken along lines VI-VI.

As shown in FIG. 5, a semiconductor device 101 mainly includes a substrate 102, a thin-film circuit layer 103, and an reinforcing section 104. Similar to the first embodiment, the thin-film circuit layer 103 is provided at a center portion of the substrate 102 in plan view. In the second embodiment, the reinforcing section 104 is provided in a multilayered manner on the substrate 102 so as to surround the thin-film circuit layer 103. For example, the protrusions are provided, for example, in a triple-layered manner in FIGS. 5 and 6.

As described above, according to the second embodiment, since the protrusions as the reinforcing sections 104 are provided in a multi-layered manner, the cracks and the notches can be prevented from spreading from grooves of the substrate 102 in a multilayered manner. Accordingly, the substrate 102 can be made stronger, resulting in that the thin-film circuit layer can be more securely prevented from breaking up.

Third Embodiment

Figure 7:
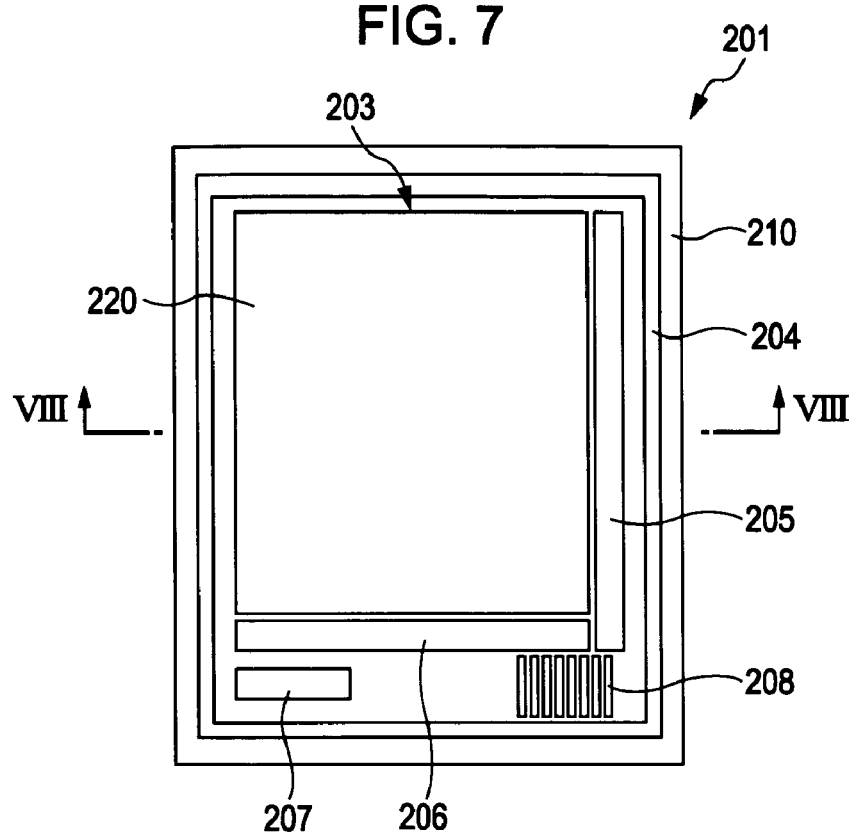
FIG. 7 is a plan view showing a structure of a liquid crystal device according to a third embodiment of the invention.

A third embodiment of the invention will now be described. FIG. 7 is a plan view showing a structure of a liquid crystal device 201 according to the third embodiment.

As shown in FIG. 7, the liquid crystal device 201 has such a structure that a counter substrate 220 is stacked on a TFT array substrate 210 made of a transparent resin material such as PES and the two substrates are attached to each other through a sealing material (not shown) provided therebetween. A liquid crystal layer (not shown) is sealed within a region surrounded by the sealing material. The region enclosed by the sealing material is a light modulation area 203 (viewing area) in which light from the outside is modulated.

In a region (extending region) of the TFT array substrate 210 extending from the counter substrate 220, driving circuits such as a scanning line drive circuit 205 and a data line drive circuit 206, a conducting portion 207 which allows electrical conduction between the TFT array substrate 210 and the counter substrate 220, and a connecting portion 208 for connection with an external terminal are provided.

The extending region is provided with an reinforcing section 204 along an outer periphery of the TFT array substrate 210. The reinforcing section 204 is made of a resin material such as acrylic or polyimide and is provided such that it surrounds the light modulation area 203, the scanning line drive circuit 205, the data line drive circuit 206, the conducting portion 207, and the connecting portion 208. Similar to the first embodiment, it is preferable that a height of the reinforcing section 204 from the surface of the substrate 202 be equal to or less than 10 μm.

Figure 8:
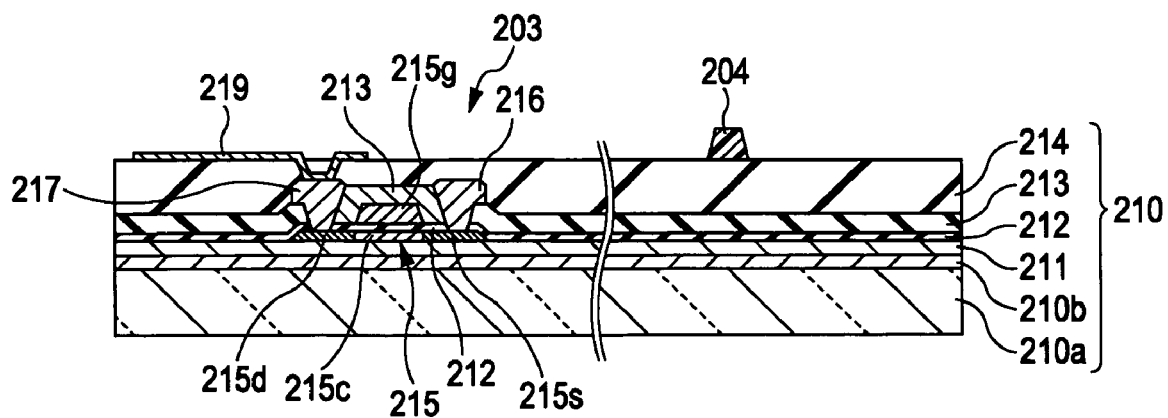
FIG. 8 is a cross sectional view showing a structure of the liquid crystal device according to the third embodiment.

FIG. 8 is a view showing a structure of the liquid crystal device in FIG. 7 taken along lines VIII-VIII. For ease of explanation, a cross sectional structure of only the TFT array substrate 210 is illustrated. As shown in FIG. 8, the TFT array substrate 210 of the liquid crystal device 201 has such a structure that a base layer 210a, a bonding layer 210b, a base layer 211, a gate insulation layer 212, a first insulation layer 213, and a second insulation layer 214 are stacked on top of one another in this order. The extending region of the TFT array substrate 210 is provided with the reinforcing section 204 such that it projects from a surface of the second insulation layer 214. Therefore, the region of the substrate 202 in which the reinforcing section 204 is provided is thicker than the other region of the substrate.

The light modulation area 203 of the TFT array substrate 210 is provided with a pixel electrode 219, a thin-film transistor 215, a source electrode 216, and a drain electrode 217. The pixel electrode 219 is provided on an area corresponding to a pixel cell of the light modulation area 203. The thin-film transistor 215 is provided between the adjacent pixel cells of the light modulation area 203, and mainly includes a semiconductor film having a channel region 215c, a source region 215s, a drain region 215d, and a gate electrode 215g. The source electrode 216 is connected to the source region 215s of the semiconductor film. The drain electrode 217 is provided such that it allows a communication between the gate insulation layer 212, the first insulation layer 213, and the second insulation layer 214 and connects the drain region 215d of the semiconductor film with the pixel electrode 219.

Figure 9:
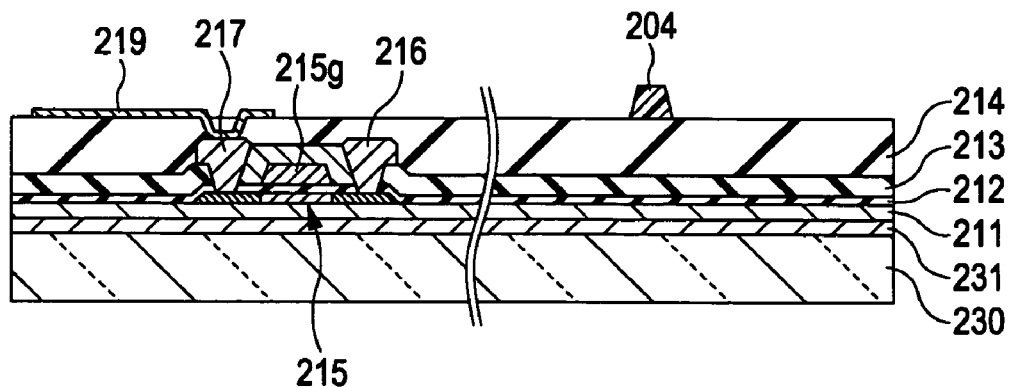
FIG. 9 is a flowchart showing a manufacturing process of the liquid crystal device according to the third embodiment.

A method of manufacturing the liquid crystal device 201 having the above structure will now be explained. Here, the explanation will focus on a process of manufacturing the TFT array substrate 210. Initially, as shown in FIG. 9, a release layer 231 is formed on a glass substrate 230, then the base layer 211, the semiconductor film, the gate insulation layer 212, the gate electrode 215g, the first insulation layer 213, the source electrode 216, the drain electrode 217, the second insulation layer 214, and the pixel electrode 219 are formed on the release layer 231 in this order, and finally the reinforcing section 204 is formed on the second insulation layer 214 by using, for example, a dispenser. For the release layer 231, such a material will, for example, be used that the material changes its nature when it is exposed to ultraviolet radiation to thereby have its adhesive property degraded.

Figure 10:
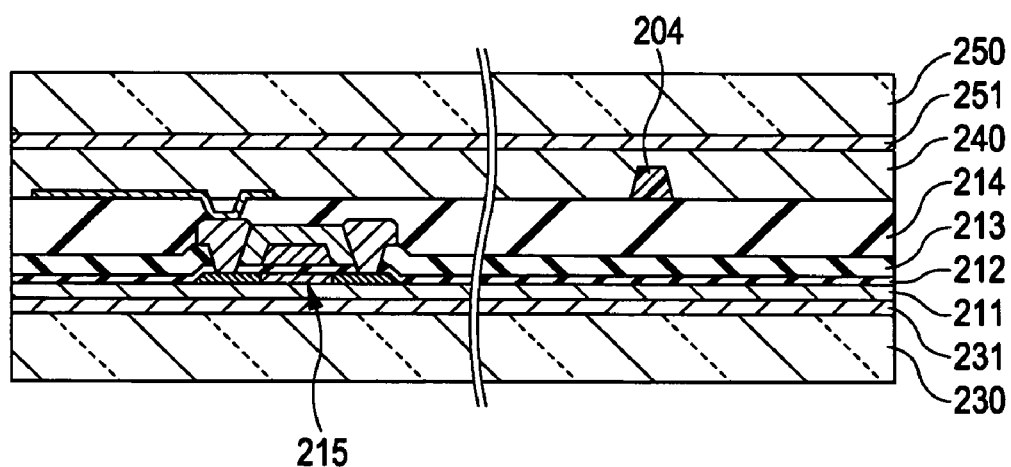
FIG. 10 is the flowchart of FIG. 9.

As shown in FIG. 10, a temporary bond 240 is formed on the second insulation layer 214 including the reinforcing section 204 and the pixel electrode 219 to bond a release layer 251 and a glass substrate 250 through the temporary bond 240. Similar to the release layer 231, such a material will be used for the release layer 251 that the material changes its nature when it is exposed to an ultraviolet radiation to thereby have its adhesive property degraded.

Figure 11:
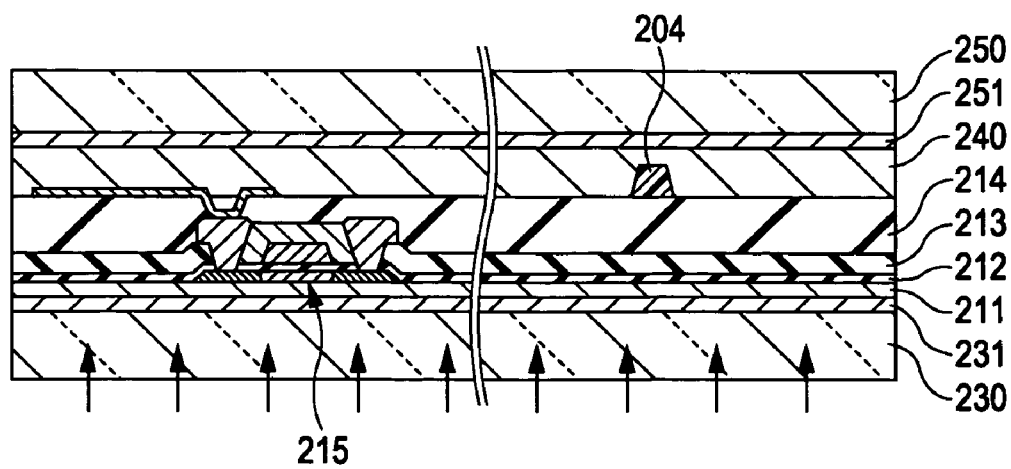
FIG. 11 is the flowchart of FIG. 9

Now, as shown in FIG. 11, an ultraviolet ray is irradiated to the release layer 231 from a side of the glass substrate 230 in order to change the nature of the release layer 231.

Figure 12:
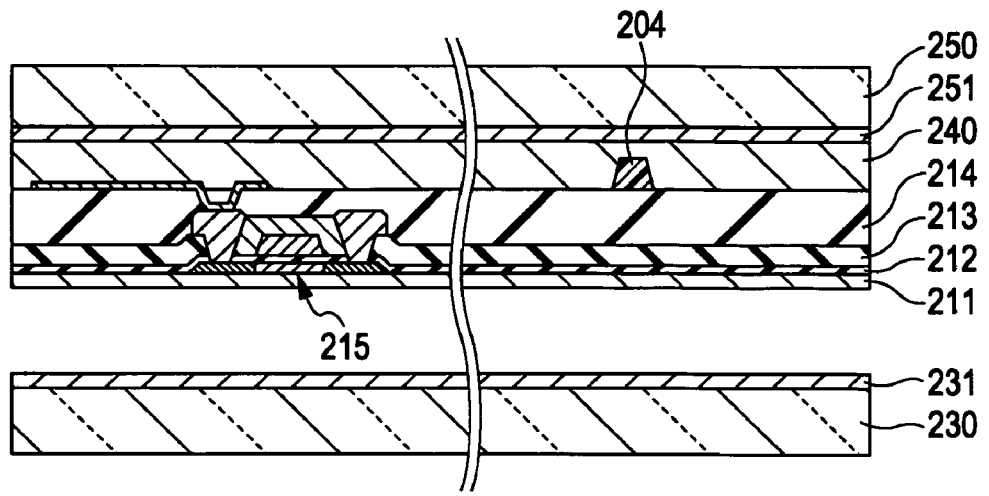
FIG. 12 is the flowchart of FIG. 9
Figure 13:
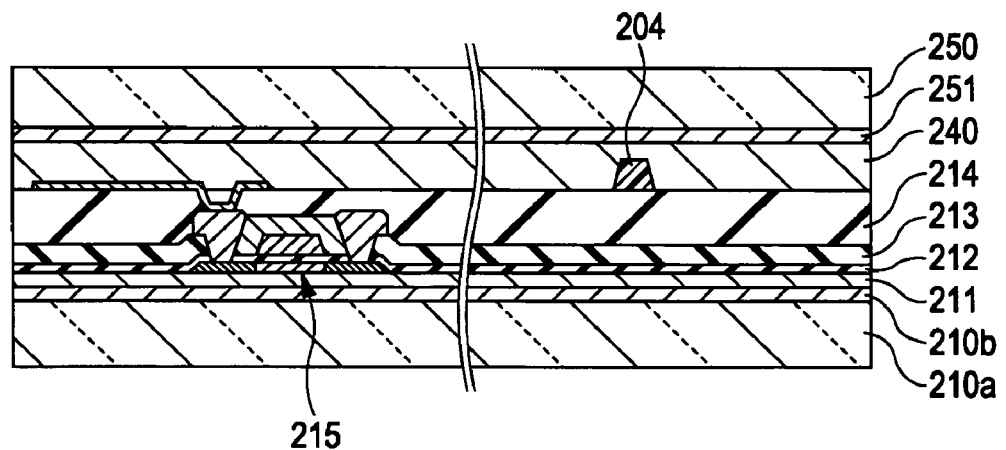
FIG. 13 is the flowchart of FIG. 9

After changing the nature of the release layer 231, the glass substrate 230 is delaminated as shown in FIG. 12. The glass substrate is delaminated from an inner surface of the release layer 231 or an bonding interface where the adhesive ability has been degraded. After the base layer 211 is delaminated, the base layer 210a is bonded onto the base layer 211 through an adhesion layer 210b, as shown in FIG. 13.

Figure 14:
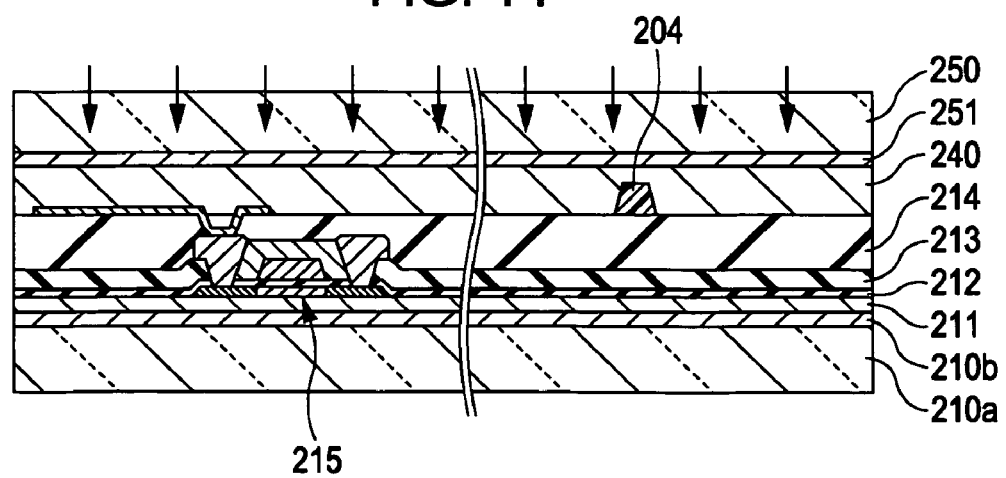
FIG. 14 is the flowchart of FIG. 9

As shown in FIG. 14, an ultraviolet ray is irradiated onto the release layer 251 from a side of the glass substrate 250 in order to change the nature of the release layer 251.

Figure 15:
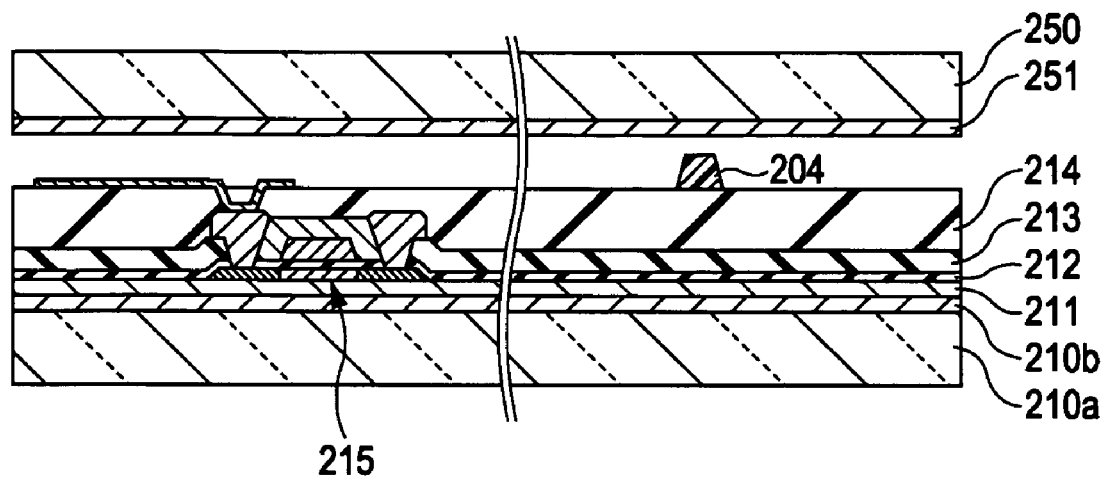
FIG. 15 is the flowchart of FIG. 9
Figure 16:
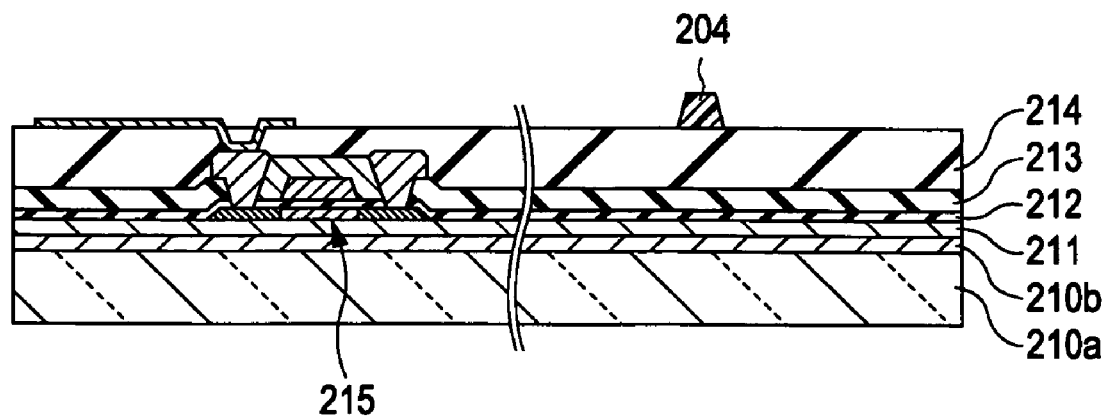
FIG. 16 is the flowchart of FIG. 9

After changing the nature of the release layer 251, the glass substrate 250 is delaminated as shown in FIG. 15. Accordingly, the TFT array substrate 210 is finally obtained as shown in FIG. 16.

In the liquid crystal device 201 according to the third embodiment, similar to the semiconductor device 1, the reinforcing section 204 which reinforces the TFT array substrate 210 is provided on the surface of the TFT array substrate 210 so as to surround the light modulation area 203 and the like, such that the region of the TFT array substrate 210 where the reinforcing section 204 is provided will have an improved strength. Accordingly, even in the case where cracks occur in the vicinity of end sides of the TFT array substrate 210, the cracks can be prevented from expanding. As such, the liquid crystal device 201 having a highly secured reliability will be obtainable.

According to the third embodiment, the thin-film transistor 215 (thin-film circuit layer) is formed on the glass substrate 230 (first substrate) having the release layer 231 (surface layer), the reinforcing section 204 is formed on the release layer 231 which surrounds the thin-film transistor 215, and then the thin-film transistor 215 and the release layer 231 are transferred onto the base layer 210a (second substrate) having the base layer 210b on its surface, such that the thin-film transistor 215 and the reinforcing section 204 can be formed even on a substrate having a low heat resistance property such as a resin film as well as, of course, can also be formed on a substrate having a high heat resistance property such as a glass substrate. As described above, the third embodiment will give us a lot of options when selecting a substrate including the thin-film transistor 215 and the reinforcing section 204. Thus manufactured semiconductor device 201 is applicable to various uses.

According to the third embodiment, the region of the base layer 210a where the reinforcing section 204 is provided is doubly reinforced by reinforcement provided by the reinforcing section 204 and a joint provided by transfer printing, such that the thin-film transistor 215 can be securely prevented from breaking up. As such, the liquid crystal device 201 having a high reliability is obtainable.

Fourth Embodiment

Figure 17:
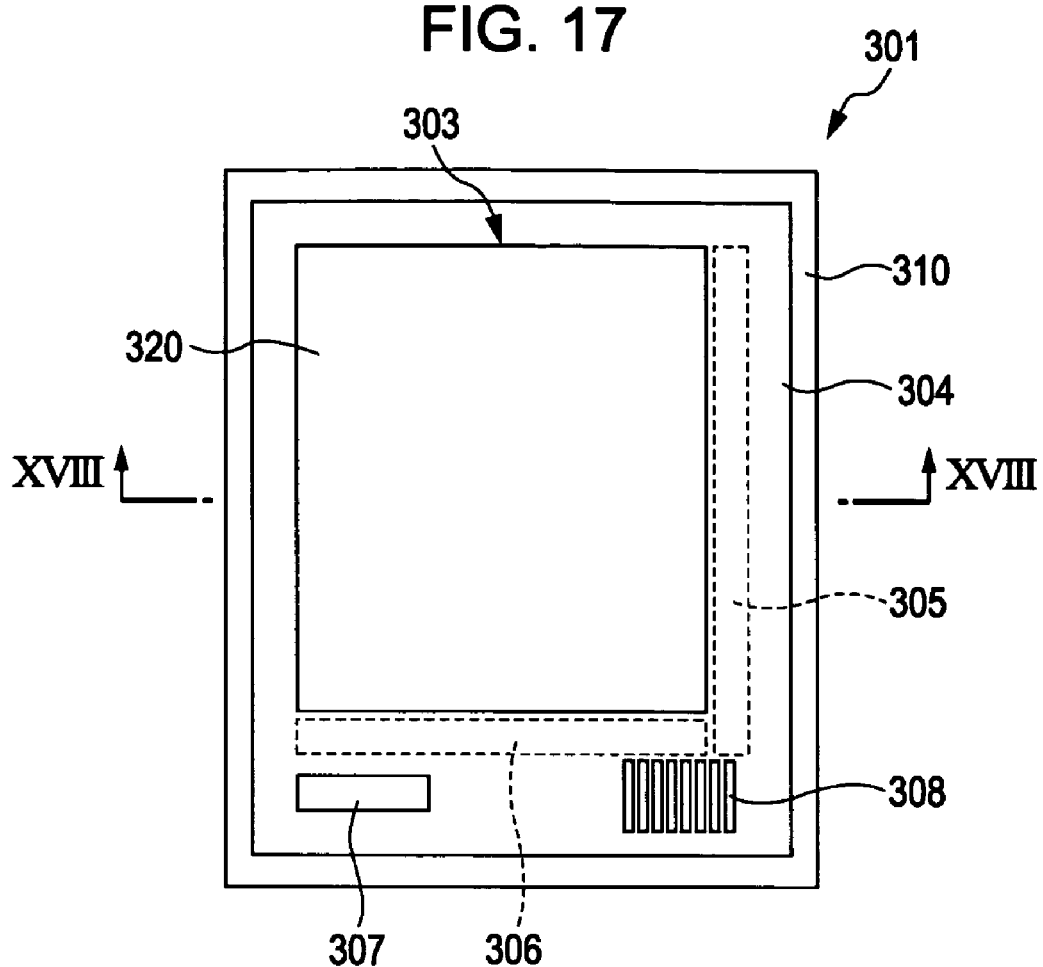
FIG. 17 is a plan view showing a structure of a liquid crystal device according to a fourth embodiment of the invention.

A fourth embodiment of the invention will now be described. FIG. 17 is a plan view showing a structure of a liquid crystal device 301 according to the fourth embodiment.

As shown in FIG. 17, similar to the third embodiment, the liquid crystal device 301 has such a structure that a counter substrate 320 is stacked on a TFT array substrate 310 made of a transparent resin material such as acrylic and PES and the two substrates are bonded to each other through a sealing material (not shown) provided therebetween. A liquid crystal layer (not shown) is sealed within a region surrounded by the sealing material. The region inside the sealing material is a light modulation area 303 (viewing area) in which light from the outside is modulated.

In a region (extending region) of the TFT array substrate 310 expanding from the counter substrate 320, similar to the third embodiment, drive circuits such as a scanning line drive circuit 305 and a data line drive circuit 306, a conducting portion 307 which allows electrical conduction between the TFT array substrate 310 and the counter substrate 320, and a connecting portion 308 for connection with an external terminal are provided.

According to the fourth embodiment, the reinforcing section 304 is provided along an outer periphery of the TFT array substrate 310 in such a manner that it surrounds the light modulation area 303 as well as covers an entirety of the extending region. The reinforcing sections 304 are provided at sides of upper layers of the scanning line drive circuit 305 and the data line drive circuit 306 as well as are provided so as to surround the conducting portion 307 and the connecting portion 308. Other aspects of the structure are generally identical to those of the third embodiment.

Figure 18:
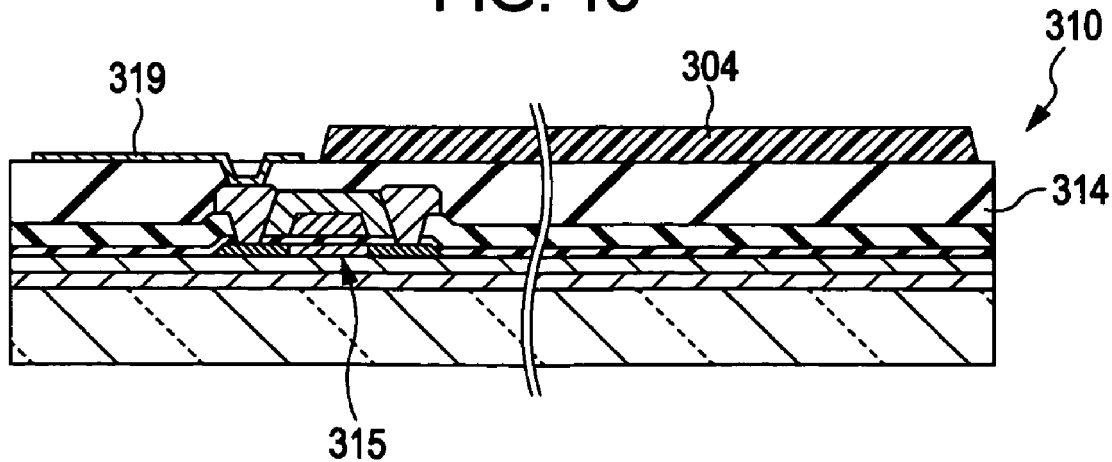
FIG. 18 is a cross sectional view showing a structure of the liquid crystal device according to the fourth embodiment.

FIG. 18 is a view showing a cross sectional structure of the liquid crystal device in FIG. 17 taken along lines XVIII-XVIII. FIG. 18 illustrates a cross sectional structure of only the TFT array substrate 310. As shown in FIG. 18, the reinforcing section 304 is provided so as to cover a second insulation layer 314 of the extending region of the TFT array substrate 310. The region of the substrate 202 in which the reinforcing section 304 is provided is thicker than the other region of the substrate, and thus this region of the TFT array substrate 310 has an improved strength compared to the other region owing to the reinforcing section. Similar to the above embodiments, it is preferable that a height of the reinforcing section 304 from the surface of the second insulation layer 314 be equal to or less than 10 μm.

As described above, according to the fourth embodiment, the reinforcing section 304 is provided such that it covers the entirety of the extending region of the TFT array substrate 310, so that the TFT array substrate 310 can have the improved strength at the region with the reinforcing section. As such, a reliability of the liquid crystal device 301 can be further enhanced.

Fifth Embodiment

Figure 19:
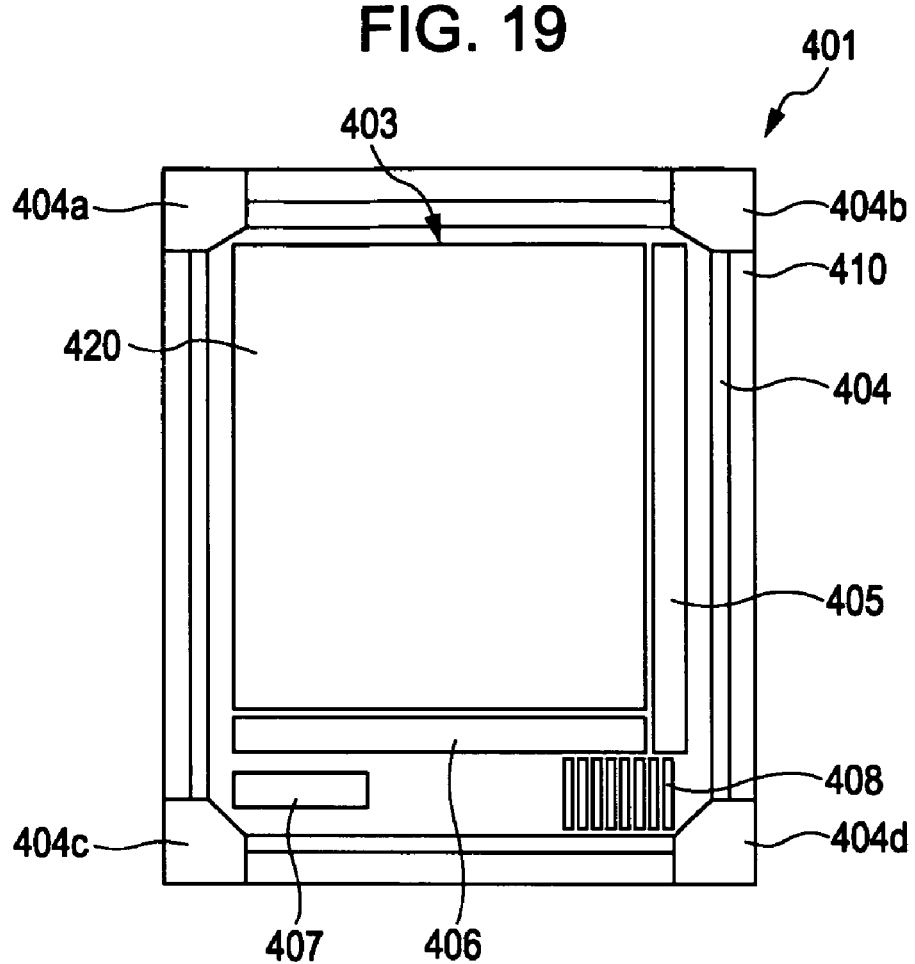
FIG. 19 is a plan view showing a structure of a liquid crystal device according to a fifth embodiment of the invention.

A fifth embodiment of the invention will now be described. FIG. 19 is a plan view showing a structure of a liquid crystal device 401 according to the fifth embodiment.

As shown in FIG. 19, the liquid crystal device 401 has a basic structure generally identical to that of the liquid crystal device 201 according to the third embodiment except for having reinforcing sections 404a, 404b, 404c, 404d provided at corners of a TFT array substrate 410.

When a motherboard is divided into a plurality of rectangular substrates by a multipatterning process, cracks and notches tend to occur at corners of the rectangular substrates. According to the fifth embodiment, the rectangular TFT array substrates 410 are each provided with the reinforcing sections 404a-404d at corners thereof, such that the cracks and the notches can be prevented more securely from expanding into the thin-film circuit layer.

Sixth Embodiment

Figure 20:
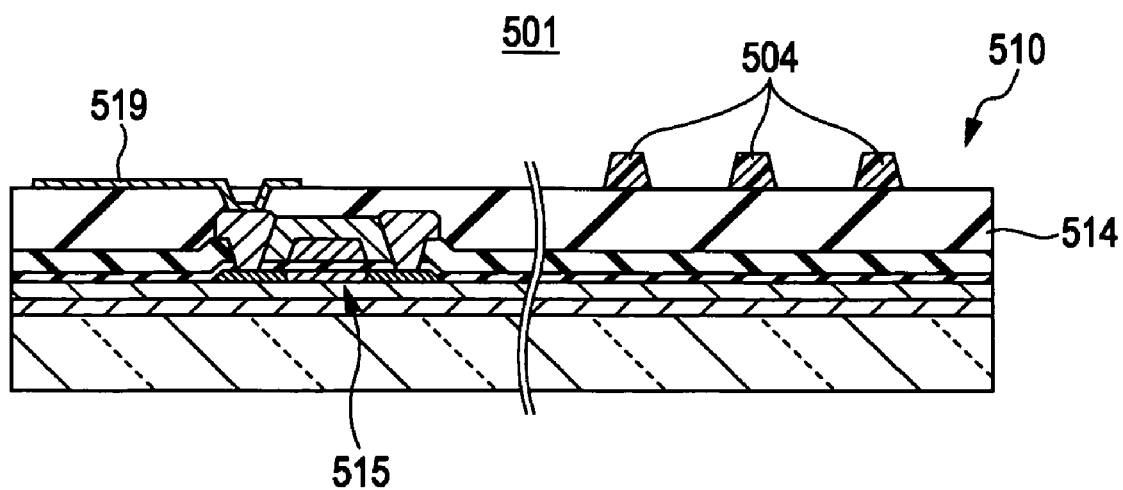
FIG. 20 is a cross sectional view of a structure of a liquid crystal device according to a sixth embodiment of the invention.

A sixth embodiment will now be described. FIG. 20 is a cross sectional view showing a structure of a liquid crystal device 501 according to the sixth embodiment. The liquid crystal device 501 has a basic structure generally identical to that of the liquid crystal device 201 according to the third embodiment. FIG. 20 illustrates a cross sectional structure of only a TFT array substrate 510 for ease of explanation.

As shown in FIG. 20, the TFT array substrate 510 is provided with multiple protrusions working as the reinforcing sections 504. According to the sixth embodiment, since multiple protrusions are provided, the cracks and the notches can be prevented from spreading from end sides of the TFT array substrate 510 with the multiple protrusions. As such, the strength of the TFT array substrate 510 can be further improved.

In the meantime, the reinforcing sections 504 made of the multiple protrusions can be formed by the transfer printing having been described in the above embodiments. If the transfer printing is used, since the reinforcing sections 504 can be preliminarily formed on the other substrate, there is such an advantage that the reinforcing sections 504 can be readily formed even on a substrate to which it would be difficult to transfer the reinforcing sections 504 directly.

Seventh Embodiment

Figure 21:
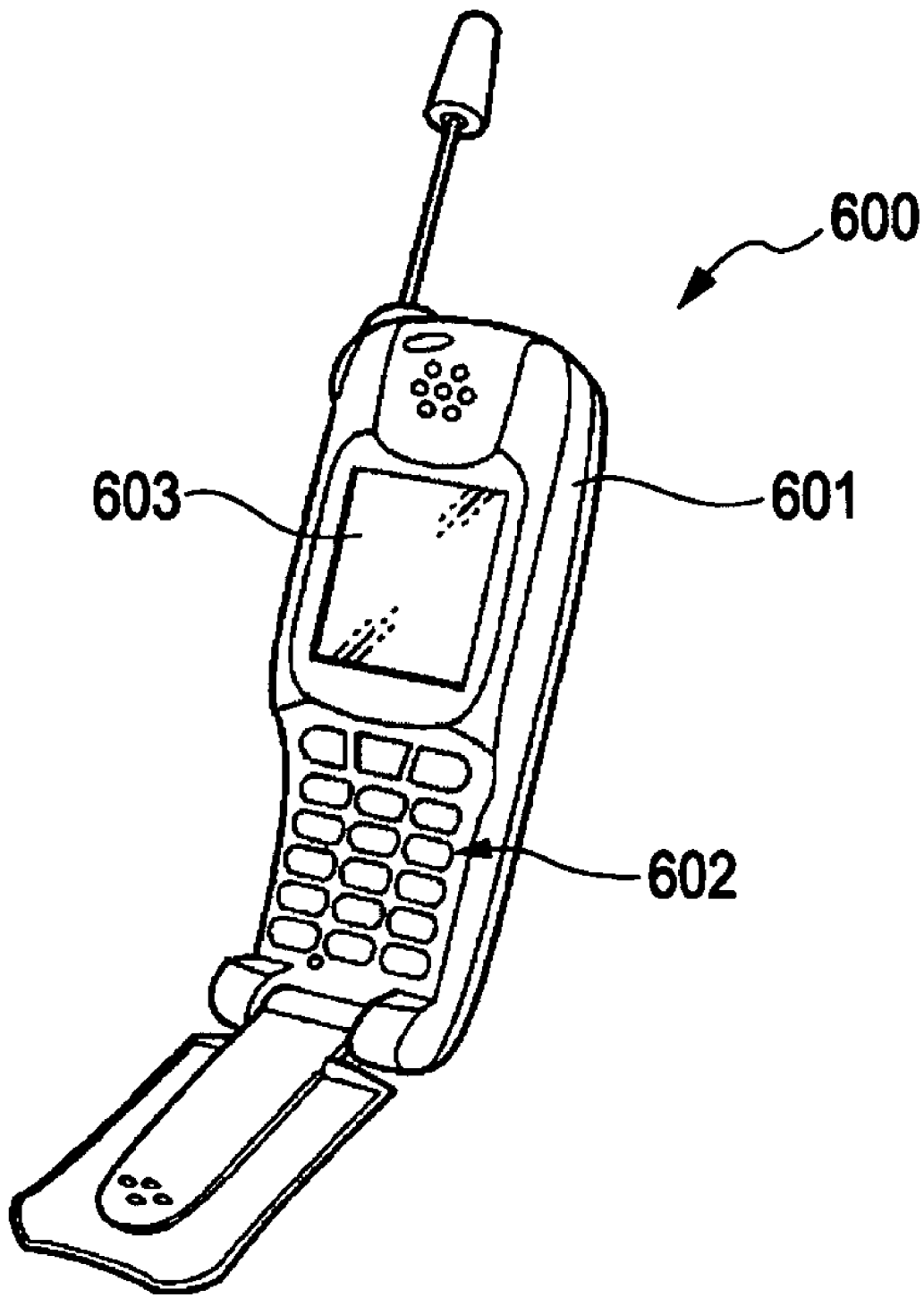
FIG. 21 is a perspective view of a structure of a cellular phone according to a seventh embodiment of the invention.

A seventh embodiment will now be described. FIG. 21 is a perspective view showing an entire structure of a cellular phone 600 according to the seventh embodiment.

FIG. 21 is a perspective view showing an entire structure of the cellular phone 600.

The cellular phone 600 mainly includes a housing 601, an operation section 602 with a plurality of operation buttons, and a display section 603 which displays an image or a motion picture, characters, and the like. The display section 603 includes any of the above described liquid crystal devices 201-501.

Since one of the liquid crystal devices 201-501 having high reliabilities are provided, a high quality cellular phone 600 less susceptible to breakdown and malfunction is obtainable.

What is claimed is:

1. A semiconductor device comprising:
   a substrate with a resin layer on at least a surface thereof;
   a thin-film circuit layer provided on the substrate, the thin-film circuit layer including a thin-film transistor and an insulation layer covering the thin-film transistor; and
   a first reinforcing section provided on the surface of the insulation layer, the first reinforcing section being provided along a periphery of the substrate in plan view.

2. The semiconductor device according to claim 1, wherein the first reinforcing section is a protrusion provided on the surface of the insulation layer.

3. The semiconductor device according to claim 1, wherein:
   a second reinforcing section is provided on a region of the insulation layer outside the first reinforcing section; and
   the first reinforcing section and the second reinforcing section are provided in a multilayered manner.

4. The semiconductor device according to claim 3, wherein:
   the substrate is of a rectangular shape; and
   the second reinforcing section is provided over a region of the substrate including the corner of the substrate.

5. An electronic apparatus comprising the semiconductor device according to claim 1 installed therein.

6. The semiconductor device according to claim 1, wherein:
   the substrate is of a rectangular shape; and
   the first reinforcing section is provided over a region of the substrate including a corner of the substrate.

* * * * *